United States Patent [19]

Kempf et al.

[11] Patent Number: 5,112,469
[45] Date of Patent: May 12, 1992

[54] APPARATUS FOR THE INWARD AND OUTWARD TRANSFER OF A WORKPIECE IN A VACUUM CHAMBER

[75] Inventors: Stefan Kempf, Alzenau; Jaroslav Zejda, Rodenbach, Fed. Rep. of Germany

[73] Assignee: Leybold Aktiengesellschaft, Fed. Rep. of Germany

[21] Appl. No.: 572,263

[22] Filed: Aug. 27, 1990

Related U.S. Application Data

[63] Continuation-in-part of Ser. No. 402,637, Sep. 5, 1989.

[30] Foreign Application Priority Data

Mar. 30, 1989 [DE] Fed. Rep. of Germany ....... 3910244
Mar. 26, 1990 [DE] Fed. Rep. of Germany ....... 4009603

[51] Int. Cl.⁵ .............................................. C23C 14/56
[52] U.S. Cl. ........................ 204/298.25; 204/298.28; 118/719; 118/730; 414/217; 414/223
[58] Field of Search ...................... 204/298.15, 298.23, 204/298.25, 298.26, 298.27, 298.28, 298.35; 118/719, 723, 728, 729, 730; 414/217, 222, 221, 223

[56] References Cited

U.S. PATENT DOCUMENTS

| | | | |
|---|---|---|---|
| 3,915,117 | 10/1975 | Schertler | 118/49 |
| 4,756,815 | 7/1988 | Turner et al. | 204/298.25 |
| 4,869,801 | 9/1989 | Helms et al. | 204/298.27 X |
| 4,886,592 | 12/1989 | Anderle et al. | 204/298.25 |
| 4,938,858 | 7/1990 | Zejda | 204/298.25 |
| 4,943,363 | 7/1990 | Zejda et al. | 204/298.15 |

FOREIGN PATENT DOCUMENTS

| | | |
|---|---|---|
| 0291690 | 11/1988 | European Pat. Off. . |
| 3716498A1 | 12/1988 | Fed. Rep. of Germany . |
| 3735284A1 | 4/1989 | Fed. Rep. of Germany . |

Primary Examiner—Nam X. Nguyen
Attorney, Agent, or Firm—Hill, Van Santen, Steadman & Simpson

[57] ABSTRACT

An apparatus for the inward and outward transfer of a workpiece, particularly of a disk-shaped substrate in a vacuum chamber having a coating system comprising a cathode station. A conveyor means designed as a rotary table is situated inside the vacuum chamber. The rotary table accepts substrate holders which are designed as turned parts. A supporting plate is provided in the region of the inward transfer station. It supports the substrate holder and prevents a sagging thereof. The supporting plate also presses the substrate holder against the inside wall of the vacuum chamber; i.e. against a seal situated in the inside wall. As a result thereof, an airtight separation of the inward transfer chamber from the vacuum chamber and from the atmosphere is achieved. A considerable reduction in the moved masses of the rotating component parts is achieved by a skillful designing and arrangement of the component parts. A reduction in the mass moments of inertia associated therewith results since the process cycles of the coating system can sequence more quickly.

25 Claims, 3 Drawing Sheets

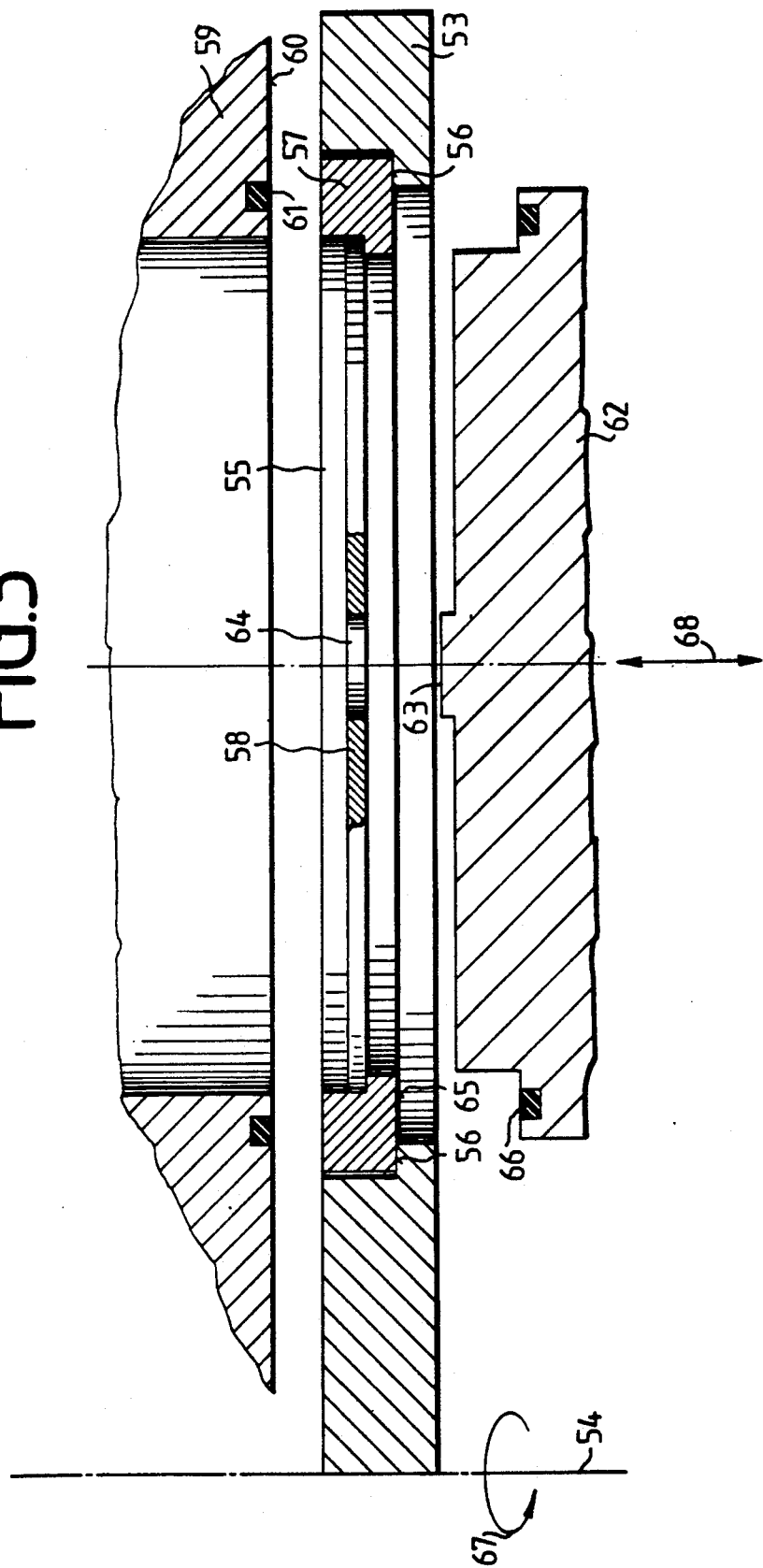

APPARATUS FOR THE INWARD AND OUTWARD TRANSFER OF A WORKPIECE IN A VACUUM CHAMBER

RELATED APPLICATION

This application is a continuation-in-part of earlier U.S. Pat. application Ser. No. 402,637 filed Sept. 5, 1989, titled "A DEVICE FOR TRANSFERRING A WORKPIECE INTO AND OUT FROM A VACUUM CHAMBER".

BACKGROUND OF THE INVENTION

The invention is directed to an apparatus for the inward and outward transfer of a workpiece in a vacuum chamber in which a conveyor means for conveying the workpiece is situated.

The coating of substrates, for example of compact disks (CD), is known in vacuum process technology, particularly in thin-film technology. Compact disks are a modern storage medium for digital information. The pressed plastic disks are coated in a sputtering process with, for example, an aluminum layer that is less than one ten-thousandth of a millimeter thick. The sputter-coating systems utilized for this purpose often have a rotary table for conveying the substrates.

A robot loads and unloads the system via a lock in a clean room. Proceeding from the lock, the rotary table conveys the substrate carrier together with the substrate through the vacuum chamber. The sputtering occurs with a high-performance sputtering cathode that is constructed as a magnetron.

German published application 3716498, incorporated herein by reference, has already disclosed an apparatus for the inward and outward transfer of an essentially flat workpiece in an evacuated chamber, and for supplying the workpiece into and returning the workpiece out of the region of a coating source for the purpose of treating the workpiece surface.

The apparatus of this published application is characterized by a coating mechanism arranged in the region of the coating chamber which has one or more cover-shaped workpiece carriers with the assistance of which workpieces can be brought into a position adjacent to an opening of the coating chamber. The opening can be closed, on the one hand, by the workpiece carrier and, on the other hand, by a lifter plate that is held and guided on a rotary table that is rotatably seated inside the coating chamber. The workpiece carrier can be pressed against the opening in the cover of the coating chamber by a lifting cylinder that is supported against the coating mechanism, and the lifting plate can be pressed by a lifting mechanism secured to the bottom plate.

Also of interest is U.S. Pat. No. 3,915,117, incorporated herein by reference. The abstract of this patent discloses a coating system for coating various products. A housing is provided which is formed of a fixed part and of a rotating covered part. The two parts together form a closed, gas-tight housing chamber. The housing chamber can be evacuated. A plurality of product carriers are carried on the movable part of the housing. The product holders are arranged at a distance from one another. They are movable so that they can be brought into various operation stations. One of these operation stages preferably comprises a gas-tight coating chamber. This chamber can be connected to the gas-tight housing chamber. The operation station is provided with separate means for evacuating the coating chamber. Movable seal means are provided at at least one station. The seal means serves the purpose of sealing the coating chamber and of the separation thereof from the housing chamber. A charging chamber is preferably attached in a separate station in the same way. It can be separately connected to the housing chamber. Alternatively, it can be separated from the housing chamber and can be separately evacuated.

European patent application 0291690, incorporated herein by reference, has disclosed an apparatus for the inward and outward transfer of an essentially flat workpiece in an evacuated coating chamber and for supplying the workpiece into and returning the workpiece out of the region of a coating source for the purpose of treating the workpiece surface.

The subject matter of this European patent application is characterized by a coating mechanism arranged in the region of the coating chamber and which has one or more cover-shaped workpiece carriers with the assistance of which the workpieces can be brought into a position adjacent to an opening of the coating chamber from which the opening can be closed, on the one hand, by the workpiece carrier and, on the other hand, by a lifting plate that is held and guided on a rotary dish that is rotatably seated inside the coating chamber. The workpiece carrier can be pressed against the opening in the cover of the coating chamber by a lifting cylinder that is supported at the charging mechanism, and the lifting plate can be pressed by a lifting mechanism secured to the bottom plate.

The apparatus of the prior art have the following disadvantages in practice, described hereafter.

The overall rotary table must be executed in extremely sturdy fashion. In order to avoid—sags in this respect, see the commentary on the bending stress of the substrate carrier that is provided later—, a sturdy construction of the substrate carrier is also necessary.

Great masses must therefore be conveyed during the process cycles. Due to the high mass moments of inertia that thus arise, the process cycles are executed in correspondingly slow fashion. A more economical and rational operation therefore has limits placed on it, given the systems of the prior art.

The substrate holder, given the apparatus of the prior art, must be constructed extremely sturdy because the substrate holder itself is exposed to high bending stresses when raising the lifting mechanisms for the substrate holder and when supporting the substrate holder against parts of the vacuum chamber.

In addition to the sturdy construction of the rotary table and substrate holder, the expense for individual parts is also extremely high in systems of the prior art. This expense is multiplied by a plurality of substrate holders in the rotary table.

SUMMARY OF THE INVENTION

It is one objective of the present invention to avoid the above described disadvantages of the prior art. Design conditions should be created for an open and lightweight construction of the rotary table and of the substrate holder.

The rotary table should essentially comprise only the parts that are necessary for the function of accepting the substrate holder. It should no longer be necessary to utilize massive components in order to avoid bendings and other deformations. The mass moments of inertia should be reduced. The work cycles should sequence more quickly. The lost times that arise due to the rotation of the rotary table should be reduced.

It should be possible to accommodate more substrate holders in a rotary table than is the case in the prior art.

Moreover, the introduction of an open-work structure should make it possible for the dimensions of the chamber (chamber thickness, chamber volume) to be considerably optimized.

In the invention, a disk-shaped conveyor means is provided with at least one through-opening whose edge is surrounded by a plate-shaped lifting and supporting element for a holding mechanism for the workpiece.

Thus, a supporting element is utilized that presses the holding mechanism against parts of the vacuum chamber.

In order to achieve a support that acts over the entire cross-section of the holding mechanism, the supporting element is designed as a supporting plate that is axially movable with a lifting mechanism.

In order to reduce the moved masses, it is provided, among other things, that the holding mechanism is designed thin, particularly as a membrane-like disk.

For centering the workpiece, the holding mechanism can be equipped with a centering device for the workpiece, particularly in the form of a projection.

The conveyor means comprises frame-shaped receptacle elements for the holding mechanism.

For fixing the holding mechanism on the conveyor means, the conveyor means comprises at least one receptacle opening for workpieces that have one or more particularly shoulder-shaped detents for an implacement of the holding mechanism in the region of their edge.

The receptacle openings are formed of axially through-recesses that are applied in a disk-shaped or dish-shaped conveyor means.

The receptacle openings are arranged and designed to be movable into the region of the supporting element by the conveyor means.

The conveyor means can be formed of a plate that is rotatably arranged in the vacuum chamber (rotary table) and that is provided with circular receptacle openings which, by rotating the table, can be brought into coaxial positions relative to the supporting elements designed as a circular supporting plate.

It is proposed in a preferred exemplary embodiment that the holding mechanism is designed as a substrate holder, particularly as a substrate holder for disk-shaped substrates; and that the rotary table in the vacuum chamber that is part of a coating system conveys the substrate holder together with the substrate into the region of one or more coating sources, particularly sputtering cathodes.

For reasons of economy, optimally small vacuum spaces are desired in vacuum-coating technology. In the present case, the vacuum chamber has a thin, gap-shaped configuration that extends in the region between the rotary table and the lower wall of the vacuum cover. Given warpings, corrugations or other irregularities of the substrates, the substrates can get jammed given lateral insertion into the gap-shaped vacuum chamber.

The system of the invention is also designed so that it works malfunction-free when the substrates have irregularities.

The moving parts of the inventive system are designed to have an optimally low mass.

In the invention, the substrate carrier is arranged and designed such that it carries the substrate only in the region of its outer edge.

The substrate holder in the inventive system has a ring shape (substrate holding ring).

The substrate holding ring is designed and arranged such that the substrate can be deposited in the substrate holding ring in the region of the outer edge of the substrate.

In a preferred exemplary embodiment, the substrate holding ring has the region of its outer circumference held in the receptacle opening of the rotary table, preferably by a shoulder, and the substrate holding ring has a shoulder for the deposit of the substrate that extends toward the middle.

In a further exemplary embodiment the supporting plate has a hat shape and is provided with a flange that is designed rim-like and extends radially outward, and the substrate holding ring lies on the flange.

It can be functionally provided that the substrate holding ring is designed as a centering ring for the substrate.

In addition, the substrate holding ring can be designed as a seal element for the vacuum chamber in the region of the inward and outward transfer.

For this purpose it is proposed that, in the upper position of the supporting plate, the substrate holding ring is clamped in sealing fashion between the wall of the vacuum chamber, particularly the inside surface of the cover of the vacuum chamber, and the supporting plate.

The following advantages are achieved with the invention. The described disadvantages of the prior art are avoided. Design conditions are created for a light-weight construction of the rotary table and of the substrate holder. Both component parts have been thinned down to their components critical to their functioning.

Due to the greatly reduced elements of mass inertia, the working cycles sequence more quickly. At the same time, data that are important for the economical working of the coating system such as the dimensions of the chamber (chamber thickness, chamber volume) are significantly improved.

A high degree of insensitivity to irregularities of the substrate is achieved with the subject matter of the invention.

Further details of the invention may be derived from the following description of three exemplary embodiments of the invention.

BRIEF DESCRIPTION OF THE DRAWINGS

FIGS. 2 and 3 show two further exemplary embodiments of the apparatus of the invention for inward and outward transfer of a disk.

DESCRIPTION OF THE PREFERRED EMBODIMENTS

The following description of the exemplary embodiment illustrates how the invention departs from the prior art discussed with reference to the aforementioned publications. The description and figures of this prior art can therefore be utilized for explaining the differences in the exemplary embodiments set forth below.

Figure 1:
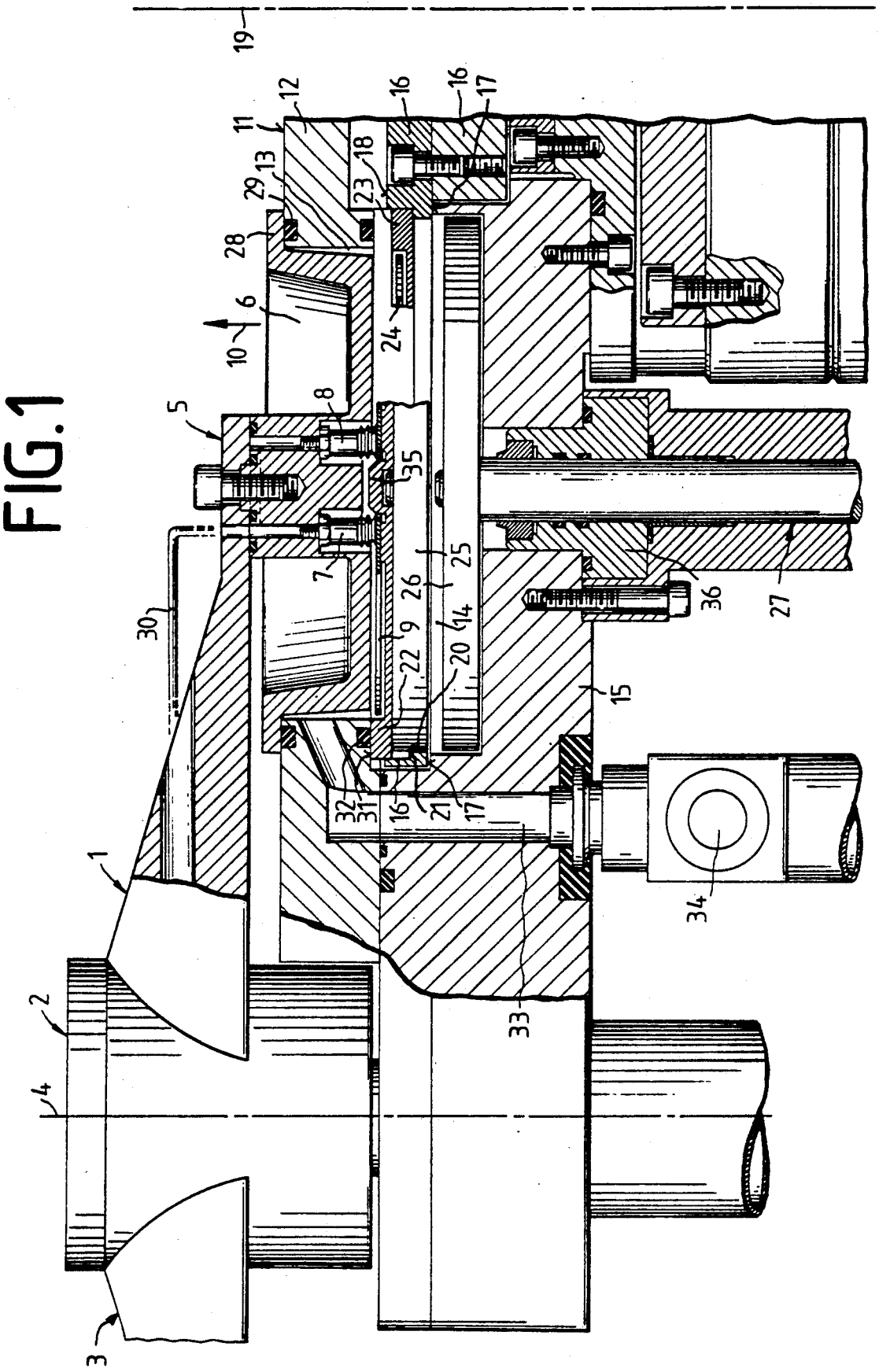
FIG. 1 shows a sectional view of an apparatus of the invention for the inward and outward transfer of a disk in a vacuum chamber of a coating system that is equipped with a cathode station (not shown)

Reference numeral 1 in FIG. 1 references a crossbeam that is rotatable and which can be lifted and lowered with the unit 2. The cross beam is part of a conveyor means which is equipped with a double swivel arm. The first swivel arm, the cross beam 1 in the present case, is shown in the figure. The second cross beam is arranged lying opposite the first cross beam and is only partially shown. It bears reference numeral 3.

The double swivel arm is rotatable, namely around the axis 4. By turning, the first cross beam is brought into the position of the second cross beam, whereas the second cross beam proceeds into the position of the first cross beam.

A cover 6 is arranged at the right-hand end 5 of the cross beam. Three suction devices, whereof two suction devices 7, 8 are shown in the figure, are accommodated in the cover, these serving the purpose of sucking up, i.e., of holding a substrate. In the present case, the substrate is formed of a disk 9 whereof only the left-hand part is shown in the figure. When the cross beam is lifted by the unit, it lifts the cover 6 in the direction of the arrow 10. After the cover has proceeded to a position above the upper edge 11 of the vacuum chamber cover 12, the cross beam can be turned by 180°, as previously described.

The inward transfer chamber 13, which is small in comparison to the vacuum chamber, can be separated from the vacuum chamber 14 of the coating system, as shall be set forth in detail later. The lower part of the vacuum chamber bears the reference number 15.

Only that part of the vacuum chamber that functionally cooperates with the inward transfer station is shown in the present figure. The vacuum chamber is constructed flat in the present exemplary embodiment. A rotary table 16 is accommodated in it. The reference number 16 is shown in multiple fashion in the figure in order to make the configuration of the rotary table clear. Only that part of the rotary table that cooperates with the transfer station is shown in the figure.

Reference numeral 17 indicates the underneath edge of the rotary table. Reference numeral 17 is shown twice in order to illustrate the position of this underneath edge. Reference numeral 18 represents the upper edge of the rotary table. The rotary table can rotate inside the vacuum chamber (which is referenced 14) around the axis 19. For example, the rotary table can comprise four receptacle openings whereof one is shown in the figure and bears the reference number 20 therein. The receptacle opening is formed as a cylindrical recess in the flat rotary table 16.

Due to the sectional view that has been selected, the receptacle opening takes on the appearance of a line 20. This is the limiting line or the cut generated surface of the cylindrical recess.

A shoulder 21 on which the substrate holder 22 can place itself is provided in the region of the edge of the generated surface 20 of the receptacle opening in the rotary table 16.

A substrate holder 23 is shown at the right side of the figure, namely in its position placed on the rotating shoulder 21. The substrate holder (see above) is referenced 22 at the left, namely in its lifted position.

Reference numeral 24 indicates the substrate or, respectively, the disk that lies in the substrate holder.

Reference numerals 25, 26 identify two positions of a supporting plate, whereby 25 references the supporting plate in its upper position and 26 references the supporting plate in its lower position. The supporting plate is axially moved by a lifting mechanism 27.

Reference numeral 36 references a seal and guide part. The region 14 is part of the vacuum chamber (see above). It is also under a vacuum during the loading and unloading.

The procedure for the inward and outward transfer of a workpiece, a disk in this case, shall be set forth below.

In a position of the cross beam 1 that is arranged in pivoted fashion by 180° relative to the position shown in the figure, the suction mechanisms 7, 8 pick up a disk, i.e., such it up. The cross beam 1, and thus the cover 6 and the disk 9, are lifted and subsequently pivoted around the axis 4 by 180°. They are then in a position above that position that is shown in the figure.

Subsequently, the cross beam together with the cover and disk is lowered and proceeds into the position as shown in the figure. The edge 28 of the cover lies on the seal 29 in sealing fashion. An O-ring is thus preferably provided.

The suction line 30, that is the vacuum line for the suction devices 7, 8, is shut off, so that the suction effect or holding effect is eliminated. The disk 9 places itself into the substrate holder 22.

The supporting plate has been previously lifted into the position 25 by the lifting mechanism 27. The substrate holder 22 is pressed by the supporting plate against the lower wall 31 of the vacuum chamber or against the seal (O-ring) 32. The inward transfer chamber 13 is now closed off in air-tight fashion from the atmosphere and from the vacuum chamber.

The inward transfer chamber is subsequently evacuated via the line 33. The lock valve 34 is correspondingly switched.

After the evacuation of the inward transfer chamber 13, the supporting plate moves into its lower position referenced 26. The inward transfer chamber 13 is now connected to the vacuum chamber 14. The substrate holder together with the disk places itself onto the shoulder 21 in the receptacle opening of the rotary table 16. In this position, the substrate holder is referenced 23 at the right in the figure, see above. The substrate lying in the substrate holder 23 bears reference numeral 24 at the right in the figure.

After the lowering of the supporting plate, the substrate holder has now lowered itself under the action of its dead weight onto the annular shoulder 21 of the rotary table and together with the substrate in the substrate holder can now rotate within the vacuum chamber. The substrate is conveyed within the vacuum chamber to further stations, for example to a coating source in the form of a sputtering cathode.

For example, four stations can be arranged in the vacuum chamber. The rotary table would then respectively turn by 90° for each station. After four 90° rotations, a working cycle would be over and the coated substrate would proceed into the position referenced 24 in the figure. The outward transfer process then follows.

At the beginning of the outward transfer process, the supporting plate is lifted from its position 26 into the position 25. The substrate or the disk thus proceeds from the position 23, 24 into the position 22, 9. The substrate carrier 22 is pressed against the seal 32 by the supporting plate 25.

As a result thereof, the inward transfer chamber is separated from the vacuum chamber. Subsequently, the inward transfer chamber is flooded via the line 33 on the basis of a corresponding switching of the lock valve 34.

After the lock chamber is flooded, the suction devices are activated by opening the suction line 30, so that the suction devices can suck up the disk and hold it.

Subsequently, the cover is lifted by the cross beam and is then pivoted by 180°. The coated disk is released by the suction devices in the left-hand position that is not shown.

In summary, it can thus be stated that a plurality of thin, membrane-like substrate carriers are arranged in a rotary table. The substrate is deposited in centered fashion in the depression of the substrate carriers. The centering of the substrates or disks occurs with a projection 35 in the center of the substrate holder.

In the inward transfer station, the thin, membrane-like substrate carriers are pressed against a seal, particularly an 0-ring, by a supporting plate and thus form the inward transfer or outward transfer chamber 13 together with the vacuum chamber cover and the cover 28 arranged thereabove. The substrate holder is formed of a relatively simple turned part preferably formed of aluminum.

The supporting plate 25, 26 is provided only in the inward transfer and outward transfer station.

The supporting plate prevents a sag of the thin substrate holder. As may be seen from the figure, the rotary table itself can also be designed extremely thin.

The mass moments of inertia of the rotary table and of the four substrate holders are thus considerably reduced.

Figure 2:
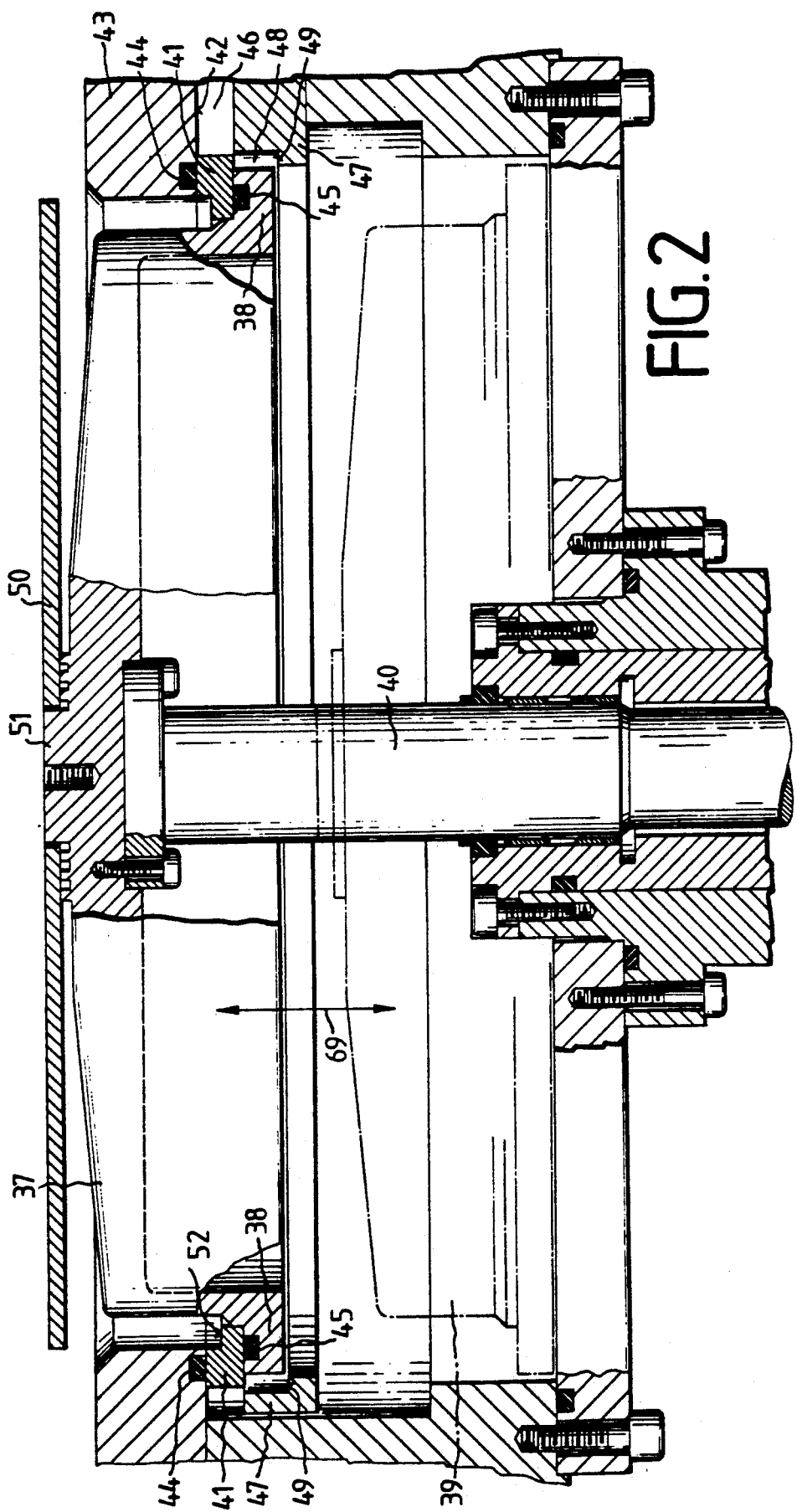

Details of a further exemplary embodiment may be derived from FIG. 2. Here, the supporting plate has a hat shape with a rim-like flange. This hat-shape supporting plate is referenced 37 in its upper position. The flange bears reference numeral 38. The movements of the supporting plate are reflected by the arrow 69.

In the exemplary embodiment of FIG. 2, the component parts are also provided in multiple fashion with their reference numerals in order to illustrate the configuration of these component parts. Thus, for example, the flange is twice referenced with reference numeral 38.

The supporting plate is referenced 39 in its lower position. The lifting mechanism for the supporting plate bears reference numeral 40.

It may be seen from FIG. 2 that in the upper position 37 of the supporting plate, the substrate holding ring 41 is held clamped between the flange 38 of the supporting plate and the lower surface 42 of the cover 43 of the vacuum chamber.

The seal 44 is provided in the cover 43 of the vacuum chamber for sealing. The seal 45 is situated in the flange 38.

In the situation shown in FIG. 2, the substrate holding ring is clamped between the seals that have just been cited. It thus forms a seal element for the vacuum chamber 46.

The rotary table is referenced 47 in FIG. 2. It comprises a receptacle opening 48 in which the substrate holding ring is accepted given the downward motion of the supporting plate. The substrate holding ring is seated on the shoulder 49 in the receptacle opening of the rotary table.

The substrate is referenced 50; it is centered by the projection 51 of the supporting plate during the inward and outward transfer procedure. Given the downward motion of the supporting plate in the downward direction, the substrate is deposited on the shoulder 52 of the substrate holding ring and is centered by the substrate holding ring.

The function sequences, particularly the inward and outward transfer procedures, correspond to the procedures that were set forth with reference to FIG. 1. For reasons of simplification, the cover (see reference numeral 6 in FIG. 1) has been omitted in FIG. 2.

FIG. 3 shows a further exemplary embodiment of the invention. The rotary table bears reference numeral 53; the rotational axis of the rotary table is referenced 54. The rotary table comprises a receptacle opening 55 that is provided with a shoulder 56. The substrate holding 57 together with the substrate 58 rests on this shoulder. The cover of the vacuum chamber is referenced 59 in this exemplary embodiment of FIG. 3.

At its lower surface 60, this cover has a seal 61 that presses against the substrate holding ring in sealing fashion when the substrate holding ring is moved up.

The supporting plate for moving the substrate holding ring bears reference numeral 62. The supporting plate is shown in its lower position in FIG. 3. It comprises a projection 63 that moves into the opening 64 of the substrate and thus centers the substrate during the inward and outward transfer. The substrate is centered by the substrate holding ring 57 during coating.

When the supporting plate is raised, the lower surface 65 of the substrate holding ring proceeds into sealing contact with the seal of the supporting plate. This seal is arranged in a shoulder of the supporting plate.

In the raised condition of the supporting plate, a sealing of the vacuum chamber is achieved by the seal 66, the clamped substrate holding ring 57, and the seal 61.

The arrow 67 references the rotation of the rotary table 53. The double arrow 68 reflects the movements of the supporting plate 62.

The cover referenced 6 in FIG. 1 has also been omitted from the exemplary embodiment of FIG. 3 for reasons of simplification. The function sequences, particularly the inward and outward transfer procedures, are the same in the apparatus of FIG. 3 as set forth with reference to FIG. 1.

The subject matter of FIGS. 2 and 3 particularly serve the purpose of achieving the object that is comprised in creating design conditions such that the system operates in a malfunction-free manner when the substrates have irregularities.

Although various minor changes and modifications might be proposed by those skilled in the art, it will be understood that we wish to include within the claims of the patent warranted hereon all such changes and modifications as reasonably come within our contribution to the art.

We claim as our invention:

1. An apparatus for inward and outward transfer of a workpiece to and from a vacuum chamber, comprising:
   a vacuum chamber;
   a disk-shaped conveyor means in the vacuum chamber for conveying the workpiece;
   holding means having a central opening and peripheral support means for supporting the workpiece;
   a plate-shaped lifting and support means having flange means for lifting and supporting the workpiece holding means;
   said disk-shaped conveyor means having at least one opening passing therethrough defining an edge which surrounds said plate-shaped lifting and supporting means when said at least one opening is aligned with the lifting and supporting means; and said holding means carrying the workpiece only in a region of an outer edge thereof.

2. An apparatus according to claim 1 wherein said workpiece comprises a disk-shaped substrate; said workpiece holding means comprises a substrate holder for receiving said disk-shaped substrate; said vacuum chamber comprises a portion of a coating system; and said disk-shaped conveyor means comprises a rotary table receiving the substrate holder and which moves the holder with the substrate therein into a region of at least one coating source of the coating system.

3. An apparatus according to claim 2 wherein said coating source comprises a sputtering cathode source.

4. An apparatus according to claim 1 wherein said holding means comprises a substrate holding ring.

5. An apparatus according to claim 4 wherein said substrate holding ring is held in a receptacle opening of a rotary table in a region of its outer circumference by a shoulder; and said substrate holding ring has a shoulder means at its inside circumference for receiving the substrate.

6. An apparatus according to claim 1 wherein said plate-shaped lifting and supporting means comprises a hat-shaped supporting plate provided with a fin-like flange which extends radially outward; said workpiece comprises a substrate; and said workpiece holding means comprises a substrate holding ring which lies on said flange.

7. An apparatus according to claim 6 wherein said substrate holding ring comprises a centering ring means for the substrate.

8. An apparatus according to claim 6 wherein said substrate holding ring has at its upper surface a seal means for mating with a downwardly facing surface of the vacuum chamber in a region of inward and outward transfer of said substrate.

9. An apparatus according to claim 6 wherein in an upper position of the supporting plate, the substrate holding ring is clamped is sealing fashion between a wall of the vacuum chamber and the flange of the supporting plate.

10. An apparatus according to claim 1 wherein said plate-shaped lifting and supporting means presses said holding means against a portion of the vacuum chamber adjacent an inward transfer chamber above the vacuum chamber.

11. An apparatus according to claim 1 wherein said plate-shaped lifting and supporting means comprises a supporting plate which is axially movable with a lifting mechanism.

12. An apparatus according to claim 1 wherein said holding means having said central opening is dimensioned to receive therethrough a portion of the plate-shaped lifting and supporting means.

13. An apparatus according to claim 12 wherein said plate-shaped lifting and supporting means has a supporting plate portion receivable in said central opening of said holding means and a flange which carries the holding means.

14. An apparatus according to claim 1 wherein said disk-shaped conveyor means comprises a shoulder-like receptacle means for receiving said workpiece holding means.

15. An apparatus according to claim 1 wherein said opening passing through the disk-shaped conveyor means has a shoulder-shaped detent means at said surrounding edge for supporting and receiving said workpiece holding means at its peripheral edge.

16. An apparatus according to claim 1 wherein said conveyor means comprises a rotary table which rotates about a rotary axis and wherein said openings passing through said disk-shaped conveyor means extends through the rotary table in a same direction as said rotary axis.

17. An apparatus according to claim 1 wherein said at least one opening passing through said disk-shaped conveyor means is movable into a region of said lifting and supporting means by rotation of the disk-shaped conveyor means.

18. An apparatus according to claim 1 wherein said conveyor means comprises a table that is rotatably arranged in the vacuum chamber and that is provided with a plurality of circular receptacle openings which, by turning the table, can be brought into coaxial position with said lifting and supporting means, said lifting and supporting means comprising a circular supporting plate.

19. An apparatus for lifting, holding and conveying a workpiece in a vacuum chamber, comprising:
a vacuum chamber;
a conveyor means in the vacuum chamber for conveying the workpiece;
a ring-like workpiece holding means within the vacuum chamber having an inwardly facing shoulder for carrying he workpiece only in a region of its outer edge;
lifting and supporting means for lifting and supporting the workpiece holding means; and
said conveyor means being movable and having at least one opening passing therethrough defining an edge which surrounds said lifting and supporting means when said at least one opening is aligned with the lifting and supporting means by movement of the conveyor means.

20. An apparatus for transfer of a substrate relative to a vacuum chamber, comprising:
a vacuum chamber;
a conveyor means in the vacuum chamber for conveying the substrate;
a ring-like substrate holding means within the vacuum chamber for carrying the substrate only in a region of its outer edge, a central portion of the holding means being open;
a lifting and supporting means having a flange for lifting and supporting the substrate holding means and a substrate lifting plate receivable through said open central portion of the holding means; and
said conveyor means being movable and having at least one opening passing therethrough defining an edge which surrounds said lifting and supporting means when said at least one opening is aligned with the lifting and supporting means by movement of the conveyor means.

21. An apparatus for inward and outward transfer of a disk-shaped workpiece in and out of a vacuum chamber, comprising:
a vacuum chamber;
a rotary table within the vacuum chamber and having at least one opening passing therethrough, a support shoulder being provided at said opening;
a movable disk-like support plate having a peripheral flange receivable through said opening when said opening is aligned with said support plate by the rotary table;

a ring-like workpiece holding means dimensioned to rest at a peripheral region on said shoulder of said opening in said rotary table, and being dimensioned to be liftable by the peripheral flange of said supporting plate passing through said rotary table opening;

said ring-like workpiece holding means carrying the workpiece only in a region of an outer edge thereof and having a central aperture dimensioned to receive therethrough the support plate when the holding means is lifted by the peripheral flange;

said vacuum chamber connecting to an inward transfer chamber with an associated opening; and cover means receivable in said inward transfer chamber opening for selectively sealing the opening, and said cover means having suction retaining means for selectively holding and releasing said workpiece.

22. An apparatus according to claim 21 wherein said suction retaining means of said cover means comprises two suction apertures passing through the cover means.

23. An apparatus according to claim 21 wherein said inward transfer chamber has a vacuum line means connected thereto for evacuating said inward transfer chamber.

24. An apparatus according to claim 21 wherein said cover means is attached to a rotatable cross beam which is rotatable about a given rotational axis and also can lift the cover means towards and away from said opening of said inward transfer chamber along said given rotational axis.

25. An apparatus according to claim 21 wherein said workpiece holding means has a peripheral upwardly facing surface portion adapted to mate with an inwardly facing surface surrounding the opening of the transfer chamber so as to seal off the vacuum chamber from the transfer chamber when the workpiece holding means is lifted by said supporting plate to a position where it abuts said inwardly facing surface.

* * * * *